United States Patent [19]

Chen

[11] Patent Number: 5,710,694

[45] Date of Patent: Jan. 20, 1998

[54] ADJUSTABLE RADIATION FIN FASTENING DEVICE FOR AN INTEGRATED CIRCUIT CHIP

[75] Inventor: Chien-chang Chen, Chungho, Taiwan

[73] Assignee: Evercool Technology Co., Ltd., Chungho, Taiwan

[21] Appl. No.: 640,158

[22] Filed: Apr. 30, 1996

[51] Int. Cl.⁶ .................................................. H05K 7/20
[52] U.S. Cl. .................. 361/703; 165/80.3; 174/16.3; 257/719; 361/710
[58] Field of Search ........................ 24/457, 453, 628, 24/458, 625; 248/505, 510, 316.7, 455–458; 267/150, 160; 165/121–126, 80.3, 185; 257/713, 719, 722, 727; 174/16.1, 16.3; 361/694, 695, 697, 687, 703, 704, 707, 709, 710, 717–719

[56] References Cited

U.S. PATENT DOCUMENTS

| | | |
|---|---|---|
| 5,305,185 | 4/1994 | Samarov .................. 361/704 |
| 5,384,940 | 1/1995 | Soule ......................... 24/453 |
| 5,436,798 | 7/1995 | Wieland, Jr .............. 361/710 |
| 5,473,510 | 12/1995 | Dozier, II .................. 361/719 |
| 5,541,811 | 7/1996 | Henningsson ............ 361/704 |
| 5,590,026 | 12/1996 | Warren ...................... 361/704 |
| 5,617,292 | 4/1997 | Steiner ....................... 361/704 |

*Primary Examiner*—Gerald P. Tolin
*Attorney, Agent, or Firm*—William E. Pelton

[57] ABSTRACT

An adjustable fastening device for integrated circuit chips of varying thicknesses includes a radiating fin, a base plate, a number of resilient cramps and a number of screws. The radiating fin has at least two opposite sides which each include an upper ledge, a lower ledge and a longitudinal recess therebetween. Each upper ledge defines at least one vertical through-hole. Each lower ledge defines at least one recess corresponding to the vertical through-hole. The base has at least two opposite sides from each of which a hook downwardly extends. The cramps corresponding to the hooks have a top portion, a side portion and an arcuate portion extending therebetween. The top portion defines a hole to engagingly receive one of the screws. The side portion defines a slot configured to receive a corresponding hook. An integrated circuit chip is received between the radiating fin and the base. Each screw is extended through the corresponding vertical hole of the radiating fin and tightened such that the integrated circuit chip is firmly retained.

6 Claims, 3 Drawing Sheets

ADJUSTABLE RADIATION FIN FASTENING DEVICE FOR AN INTEGRATED CIRCUIT CHIP

BACKGROUND OF THE INVENTION

1. Field of the Invention

The present invention relates to an adjustable fastening device for an integrated circuit chip and more particularly to a fastening device which is usable for various types of radiating fins and integrated circuit chips with various thicknesses.

2. Description of Related Art

Conventional fastening devices for an integrated circuit chip generally have a structure as shown in FIG. 5. Such kind of fastening devices comprise a base plate 60, a radiating fin 80, an integrated circuit chip 70 between the base plate 60 and the radiating fin 80, and two cramps 90. The base plate 60 is substantially rectangular and has two hooks 61 integrally formed at two opposite edges thereof. The radiating fin 80 defines two grooves 81 at two sides corresponding to the hooks 61. Each of the cramps 90 is in a form of an inverted L and has a horizontal portion 92 fastening within the groove 81 of the radiating fin 80 and a vertical portion with a lock hole 91 which receives the hook 61 of the base plate 60, whereby the integrated circuit chip 70 is fastened between the radiating fin 80 and the base plate 60.

This kind of fastening device has a fixed structure so that it can not be used for various integrated circuit chips with differing specifications. Furthermore, tightness of the fastening device is not adjustable so that a tight cramp may cause damage to the integrated circuit chip and a loose cramp may result in an inefficient heat transfer from the integrated circuit chip to the radiating fin.

Accordingly, the present invention therefore is aimed to provide an adjustable fastening device for an integrated circuit to mitigate and/or obviate the aforementioned problems.

SUMMARY OF THE INVENTION

One object of the present invention is to provide an adjustable fastening device for an integrated circuit chip and which is usable for various types of radiating fins and integrated circuit chips with various thicknesses.

Another object of the present invention is to provide an improved fastening device for an integrated circuit chip which provides a flexible fastening so that an inefficient heat transfer from the integrated circuit chip to the radiating fins can be avoided.

In accordance with one aspect of the present invention, the fastening device comprises a base plate for supporting the integrated circuit chip, having four edges and two hooks integrally formed at two opposite edges thereof; a radiating fin attached on the integrated circuit chip, the radiating fin having two opposite sides each with an upper edge, a lower edge and defining a longitudinal recess therebetween; two resilient cramps for engaging with the radiating fin, the base plate and the integrated circuit chip sandwiched therebetween; and two screws.

Each resilient cramp has horizontal top portion, a vertical portion and a curved portion integrally extending therebetween. The top portion extends into a respective longitudinal recess and defines a hole configured to threadedly receive one of the screws. The vertical portion defines a horizontal slot near a bottom thereof and is configured to engagingly receive a respective one of the hooks.

One of a pair of plain holes is respectively defined through each of the upper ledges. One of a pair of recesses is defined in a top face of each lower ledge, and aligns with a corresponding plain hole. Each screw is extended through a respective plain hole to threadedly engage with a respective resilient cramp. A distal tip of each screw is disposed in a respective recess.

In accordance with a further embodiment of the present invention, the resilient cramps are c-shaped with a hole defined in a top of each thereof.

Other objects, advantages and novel features of the invention will become more apparent from the following detailed description when taken in conjunction with the accompanying drawings.

DETAILED DESCRIPTION OF PREFERRED EMBODIMENT

Figure 1:
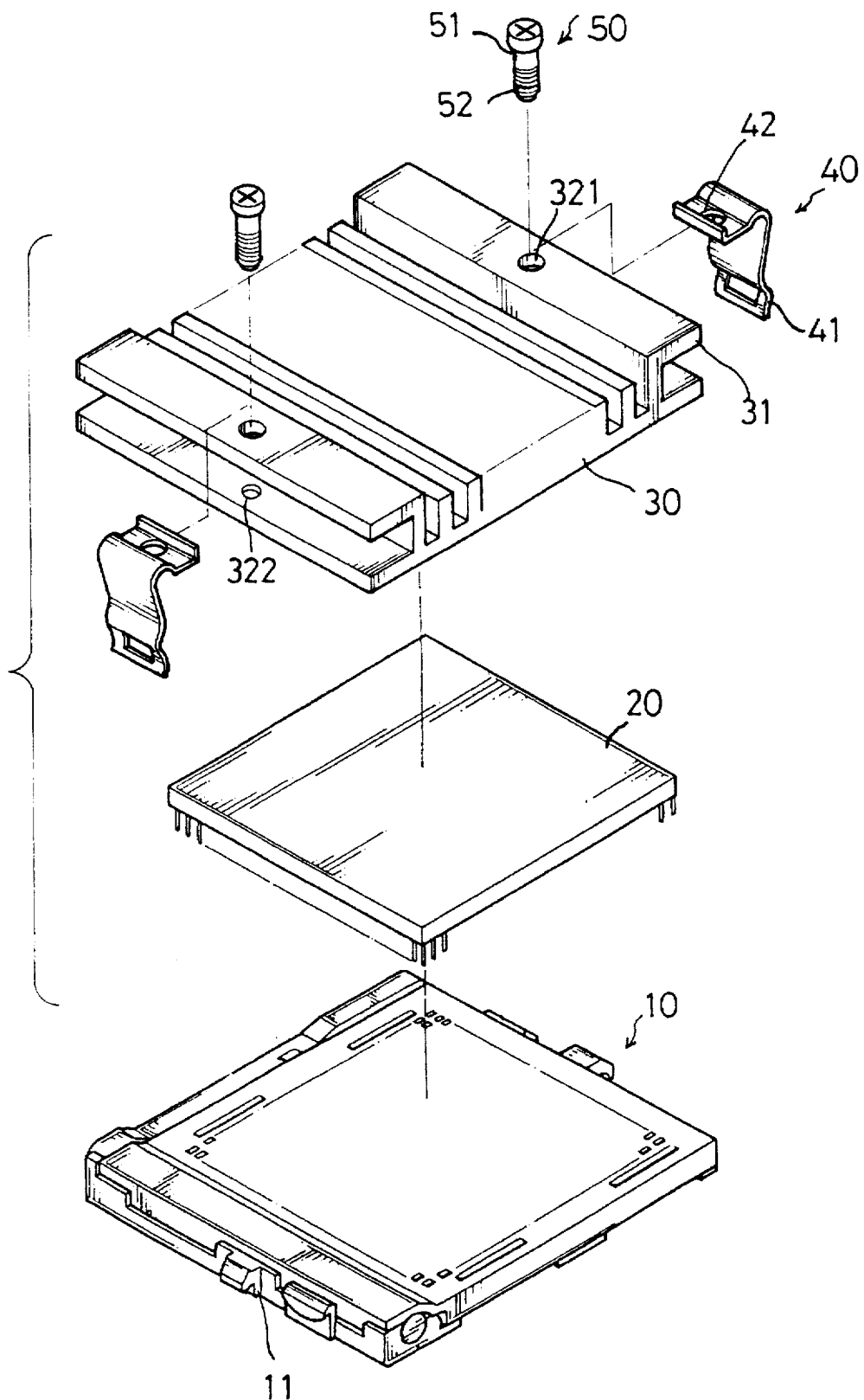
FIG. 1 is a perspective view of an adjustable fastening device in accordance with the present invention.

Referring to FIG. 1, an adjustable fastening device for an integrated circuit chip is composed of a base plate 10, a radiating fin 30, two resilient cramps 40 and two screws 50.

The base plate 10 is substantially rectangular for supporting an integrated circuit chip 20 and has two hooks 11 integrally formed at two opposite edges thereof. The radiating fin 30 is similarly rectangular and is attachable to the integrated circuit chip 20. Two opposite sides 31 of the radiating fin 30 each comprise an upper ledge and a lower ledge, each side 31 thereby defining a longitudinal recess and further defining an upper mounting hole 321 in each upper ledge and a lower mounting recess 322 in each lower ledge. The upper mounting holes 321 correspondingly align with the lower mounting recesses 322.

Figure 2:
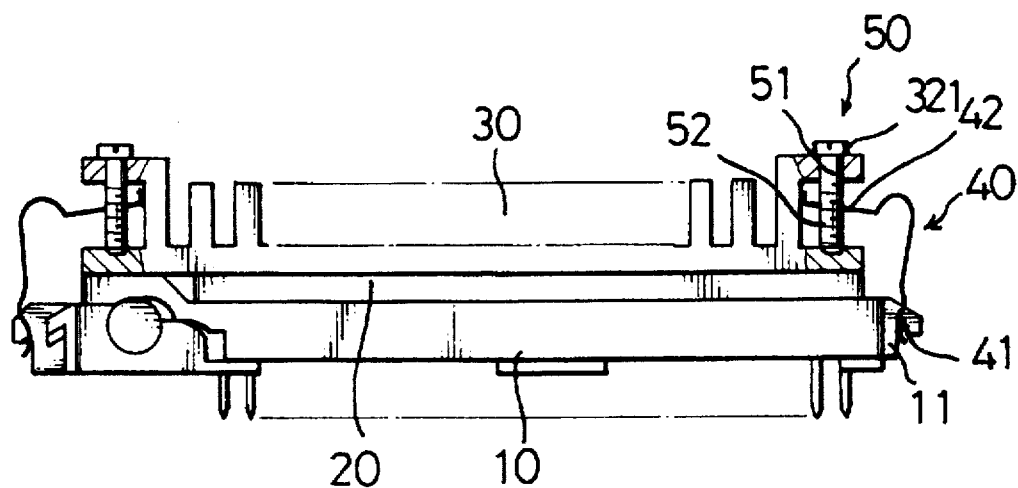
FIG. 2 and FIG. 3 are front views showing the assembly and operation of the adjustable fastening device of this invention.
Figure 3:
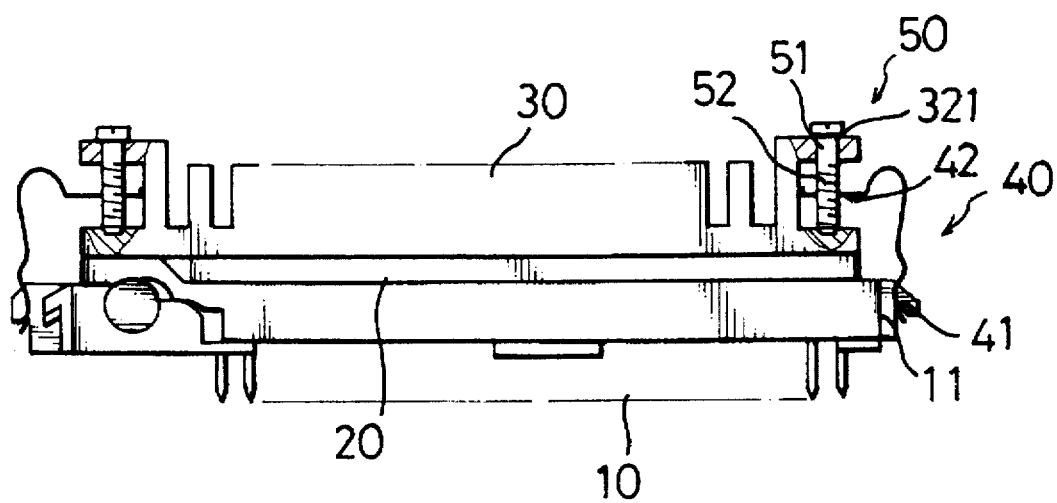

Each resilient cramp 40 comprises a substantially horizontal end (not numbered) which defines a hole 42, a substantially vertical end (not numbered) defining a slot 41 configured to receive one of the holes 11, and a curved portion (not numbered) extending integrally between the horizontal end and the vertical end. The hooks 11 each have formed at a distal tip thereof a downward and inward facing lip such that the vertical ends of the resilient cramps 40 cannot move laterally when received by the corresponding hooks 11. The two resilient cramps 40 engage the radiating fin 30 with the base plate 10 by extending each horizontal end thereof over a respective upper ledge of the radiating fin 30 and hooking each vertical end onto a respective hook 11, as seen in FIG. 2 and 3. The screws 50 each comprise a threaded lower portion 52 sized to be threadedly received in the hole 42, a cap (not numbered) and a plain shank 51 extending therebetween. Each of the upper mounting holes 321 has a diameter slightly greater than a diameter of the plain shank 51 of the screws 50. The lower mounting recess 322 has a diameter sufficiently large to receive a tip of the threaded portion 52 of each of the screws 50.

In assembly, an undersurface of the radiating fin 30 is placed on a top surface of the integrated circuit chip 20 which in turn has an undersurface which is placed on a top surface of the base plate 10. Each resilient cramp 40 is mounted to a respective one of the hooks 11 by means of the slots 41. The horizontal end of each resilient cramp 40 is received in a corresponding longitudinal recess of the radiating fin 30. Each screw 50 is inserted through a corresponding upper mounting hole 321 to threadedly engage with the respective resilient cramp 40 by means of the hole 42. As the screws 50 are tightened, the assembly of the radiating fin 30, integrated circuit chip 20 and base plate 10 is secured.

Resilience of the resilient cramps 40 permits integrated circuit chips of different thicknesses to be securely retained.

Figure 4:
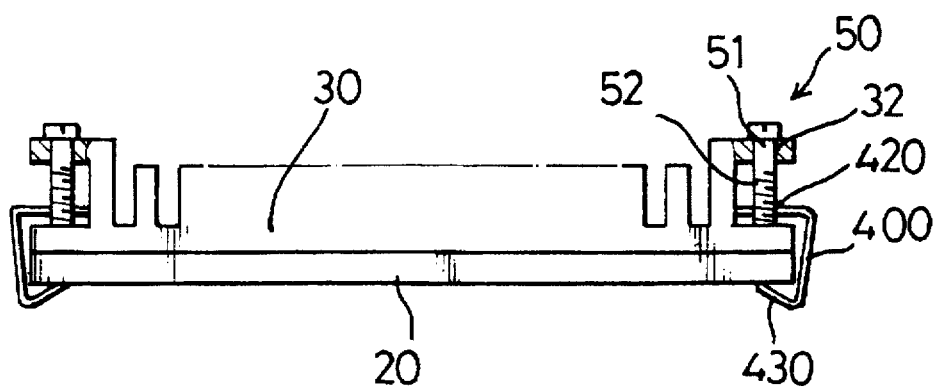
FIG. 4 is a front view showing an alternative embodiment in accordance with the present invention.
Figure 5:
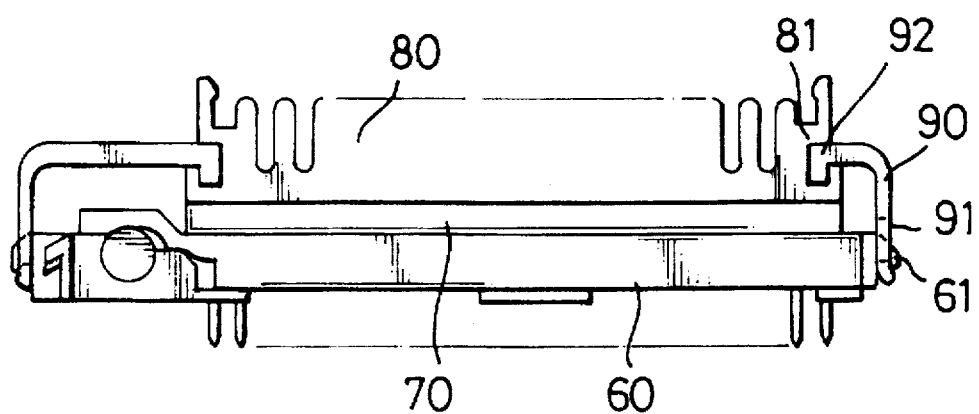
FIG. 5 is a front view showing a conventional fastening device.

Referring to FIG. 4, in a second embodiment, a pair of c-shaped clamps 400 each have a horizontal portion, a hooked bottom 430 and a substantially vertical portion extending therebetween. The top portion defines a hole 420. In this embodiment, the integrated circuit chip 20 is connected only with the radiating fin 30. The hooked bottom portion 430 of each of the cramps 400 engages against an undersurface of the integrated circuit chip 20 and the horizontal portion extends into the respective longitudinal recess of the radiating fin 30. The screws are fitted to the radiating fin 30 and clamps 400 in a manner identical to that of the first embodiment.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An adjustable fastening device for integrated circuit chips of varying thicknesses comprising:

a base adapted to carry an integrated circuit chip thereon, the base having at least two opposite sides from each of which at least one hook downwardly extends;

a radiating fin having at least two opposite sides each comprising an upper ledge and a lower ledge spaced from the upper ledge;

a plurality of screws each passing through the upper ledge to contact the lower ledge of the radiating fin, each screw being guidably rotatable about its own axis on a corresponding side of the radiating fin; and a plurality of retaining means each having a slot defined therein for engagingly receiving said hook of the base and responsive to a rotational movement of a corresponding screw to adjustably pull the radiating fin toward the integrated chip.

2. The adjustable fastening device as claimed in claim 1 wherein:

each upper ledge of the radiating fin defines at least one vertical through hole configured to receive a corresponding screw therethrough; and each lower ledge of the radiating fin defines at least one recess in a top face thereof and in alignment with the at least one vertical through hole of the upper ledge.

3. The adjustable fastening device as claimed in claim 1 wherein the plurality of retaining means are resilient cramps, each of which comprises a substantially horizontal top portion, a substantially vertical portion and an arcuate portion exending therebetween.

4. The adjustable fastening device as claimed in claim 4 wherein the horizontal portion of the resilient cramp includes a hole to receive a corresponding screw.

5. The adjustable fastening device as claimed in claim 4 wherein the vertical portion of the resilient cramp defines said slot near a bottom thereof and is configured to engagingly receive a respective hook of the base.

6. The adjustable fastening device as claimed in claim 4 wherein the resilient cramp is substantially c-shaped.

* * * * *